United States Patent [19]

Glatt

[11] Patent Number: 5,515,044
[45] Date of Patent: May 7, 1996

[54] CONTROLLER APPARATUS USING FORCE SENSING RESISTORS

[75] Inventor: Terry L. Glatt, Oakland, Fla.

[73] Assignee: Sensormatic Electronics Corporation, Boca Raton, Fla.

[21] Appl. No.: 229,380

[22] Filed: Apr. 18, 1994

[51] Int. Cl.⁶ ............................................... H03K 17/94
[52] U.S. Cl. .......................... 341/22; 341/20; 341/21; 345/156; 345/161
[58] Field of Search ........................ 345/160, 174, 345/161, 156; 341/20, 21, 22, 34; 74/471 Y; 200/252

[56] References Cited

U.S. PATENT DOCUMENTS

| | | | |
|---|---|---|---|
| 4,414,438 | 11/1983 | Maier et al. | 345/161 |
| 4,478,089 | 10/1984 | Aviles et al. | 73/862.04 |
| 4,488,017 | 12/1984 | Lee | 345/161 |
| 4,931,281 | 6/1990 | Miyawaka | 345/160 |
| 5,012,230 | 4/1991 | Yasuda | 345/160 |
| 5,045,842 | 9/1991 | Glavin | 345/161 |
| 5,065,146 | 11/1991 | Garrette | 345/161 |
| 5,159,159 | 10/1992 | Asher | 178/18 |
| 5,184,120 | 2/1993 | Schultz | 340/870.38 |
| 5,231,386 | 7/1993 | Brandenburg et al. | 345/174 |
| 5,241,308 | 8/1993 | Young | 341/34 |
| 5,269,004 | 12/1993 | Comerford et al. | 395/275 |
| 5,278,557 | 1/1994 | Stokes et al. | 341/34 |

Primary Examiner—Brent A. Swarthout
Assistant Examiner—Ashok Mannava
Attorney, Agent, or Firm—Robin, Blecker, Daley & Driscoll

[57] ABSTRACT

A controller apparatus for controlling a device comprising a support having a surface with a wall extending therefrom and along a segment of the surface. A plurality of force sensing members are positioned in a predetermined arrangement adjacent to an inner surface of the wall of the support with each member generating a signal in response to a force applied to the member. An assembly for adaptable engagement with the force sensing members is translationally movable to selectively engage and transmit a translational force to the force sensing members to develop a signal for control of a function of the device.

23 Claims, 4 Drawing Sheets

CONTROLLER APPARATUS USING FORCE SENSING RESISTORS

BACKGROUND OF THE INVENTION

This invention relates to a controller apparatus, particularly, a controller apparatus for use with force sensing resistors in a surveillance assembly, computer-related or video game device or other device.

Controllers have been used or implemented in a variety of devices and assemblies over the years, particularly, in surveillance assemblies, computer-related devices and video game assemblies. An example of a controller used for a surveillance assembly is disclosed in U.S. application Ser. No. 08/171,215 ("Paff, et al."). The controller of Paff et al. controls panning and tilting of a video surveillance camera by using a mechanical linkage assembly. The linkage assembly translates the movement of a user movable disc of the controller into signals which can be used to generate corresponding pan and tilt control signals for the surveillance camera.

Other types of controllers, such as a mouse, joystick, trackball and control keys, have been employed to control cursor movement in a computer-related device or video game assembly. To control such cursor or object movement, many of these controllers utilize some type of force sensing means.

U.S. Pat. No. 5,278,557 to Stokes, et al. ("Stokes, et al.") discloses one example of a cursor movement control key using force sensing resistors. The cursor movement control key has an external key cap engaging an actuator which bears against a force-sensing resistor upon depression and angular tilting of the external key cap. The force-sensing resistor has a junction resistance which varies inversely to the pressure applied thereto to control cursor movement.

Force sensing resistors are devices sold by Interlink, Inc. of California. A force sensing resistor is a thin film polymer device which exhibits a decrease in resistance when an increase in force is applied normal to its surface. More specifically, a force sensing resistor comprises two flat, thin polymer layers. One layer has two interleaved conductors printed on its face. The other layer has a resistance semiconductor material printed on its face. The two layers are then laminated or spaced closely together relative to one another. A spacer adhesive is generally used to laminate the two layers.

A force sensing resistor operates as follows. When no force is applied, an open circuit exists between the two layers. However, when a force is applied normal to the device, the two layers make contact to result in a closure across the two conductors through the resistive material. The conductance allowed is dependent upon the force applied and the area over which the force is applied. The resistance will change as a function of the force applied over a constant-sized area. Thus, a greater force results in a greater current flow between the conductors.

While the controllers of the above-discussed patent and patent application enable control of a device or cursor movement, the controllers are complicated structures. In addition, each controller requires a number of tiny parts which increase the cost of production of the devices. Accordingly, other types of controllers of less complication and cost are being sought.

It is, therefore, an object of the present invention to provide a controller apparatus with a simple construction.

It is a further object of the present invention to provide a controller apparatus which has a small number of parts in its design.

It is an additional object of the present invention to provide a controller apparatus which is economical to manufacture.

SUMMARY OF THE INVENTION

In accordance with the principles of the present invention, the above and other objectives are realized in a controller apparatus in which a plurality of force sensing members are arranged at predetermined positions adjacent to a wall which extends from and along a segment of the surface of a support. An assembly is provided which includes a translationally movable member which selectively engages and transmits a translational force to the force sensing members to thereby develop signals which can be used to control one or more functions of a device.

In the embodiment of the invention to be disclosed hereinafter, the support of the controller apparatus comprises a cup and the translationally movable member comprises a cylindrically-shaped puck located within the cup. The puck has top and bottom puck surfaces, a side puck surface and a centrally located recess extending from the top puck surface toward the bottom puck surface.

The force sensing members are situated between the side puck surface and the inner surface of the wall of the cup. A disk-like body is attached to the puck by a centrally located shaft which extends through a centrally located aperture of the disk-like body and is positioned in the centrally located recess of the puck. The centrally located shaft extends through the disk-like body and into a centrally located recess of a knob disposed on a top surface of the disk-like body.

BRIEF DESCRIPTION OF THE DRAWINGS

The above and other features and aspects of the present invention will become more apparent upon reading the following detailed description in conjunction with the accompanying drawings, in which.

DETAILED DESCRIPTION

Figures 1, 2, 3:
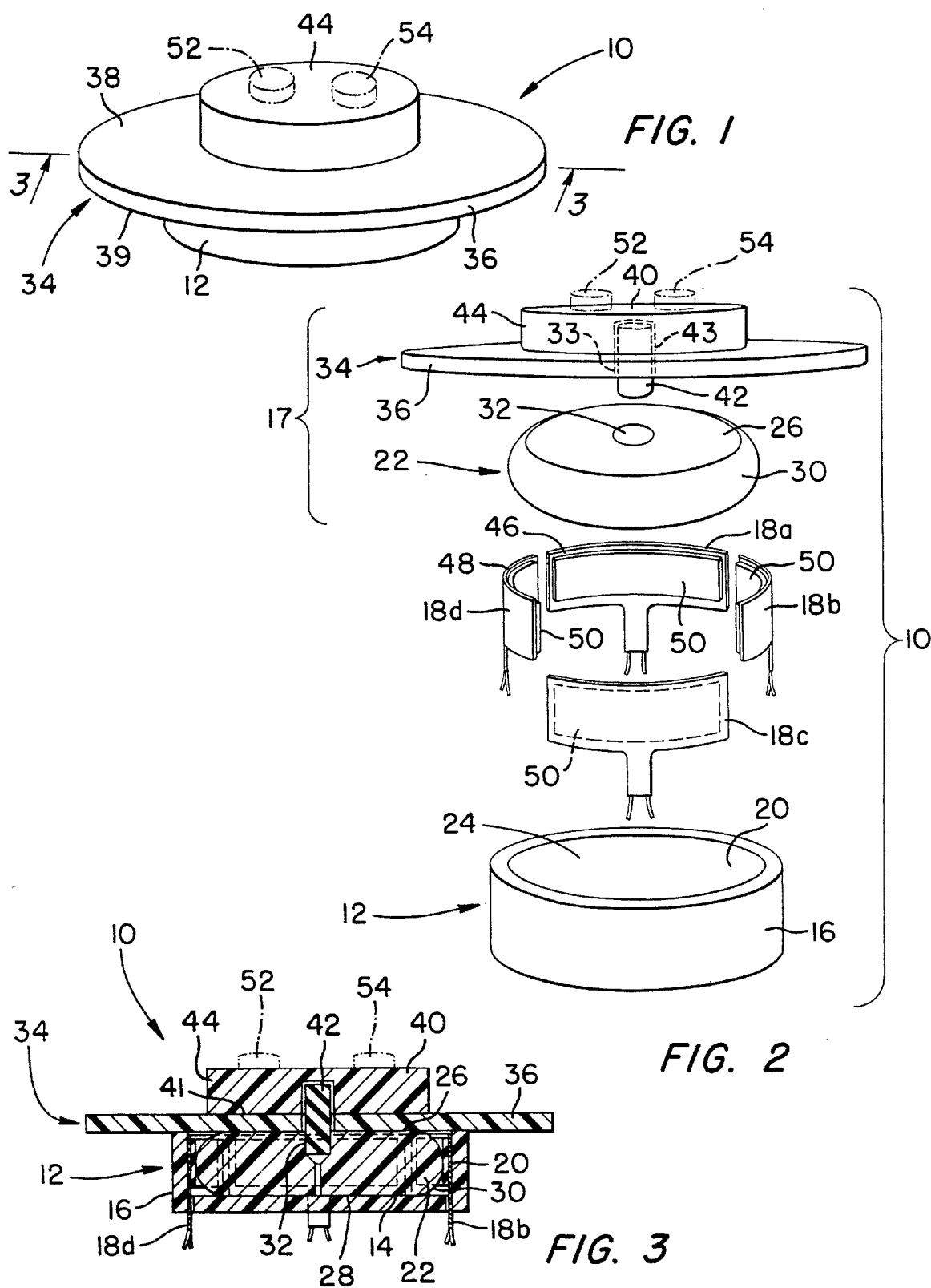
FIG. 1 shows a controller apparatus in accordance with the principles of the present invention.
FIG. 2 shows an exploded view of the controller apparatus of FIG. 1.
FIG. 3 shows a cross-sectional view taken along the line 3—3 in FIG. 1.

FIGS. 1–3 show various views of the controller apparatus 10 of the present invention. As shown, the controller apparatus 10 comprises a cup-shaped support 12 having a lower support surface 14 and a wall 16 which extends around the perimeter of the surface 14. A plurality of force sensing members or resistors 18a, 18b, 18c and 18d are positioned in a predetermined arrangement adjacent to an inner surface 20 of the wall 16.

As illustrated, the force sensing resistors are in strip form and are equally spaced at 90° intervals along the inner surface 20. More particularly, the force sensing resistors 18a–18d are centrally and symmetrically positioned about 0°, 90°, 180° and 270° positions proximate to the inner surface 20 and each resistor is in bearing engagement with the inner surface when a translational force is applied thereto.

Each force sensing resistor generates a signal which varies as a function of the amount of force applied to the resistor. As a result, by varying the applied translational force, a variable signal can be generated which can then be used to provide variable control of a function of a device. For example, if the function being controlled is speed, a light translational force or pressure on a force sensing resistor, will yield a low conductance, which can be translated into a slow speed control signal. A large translational force or pressure on a force sensing resistor, on the other hand, results in a higher conductance, which, can be translated into a fast speed control signal.

An assembly 17 serves as a mechanism for selectively providing translational forces to the force sensing resistors 18a–18d. The assembly 17 includes a first member or cylindrically-shaped puck 22. The puck 22 is supported by the cup 12 and is movably positioned within the region 24 defined by the inner surface 20 of the wall 16, as clearly shown in FIG. 3. The puck 22 has top, bottom and side surfaces 26, 28 and 30, respectively, and a centrally located recess 32 extending from the top puck surface 26 toward the bottom puck surface 28. The side surface 30 of the puck 22 is slightly rounded to allow for engagement with the force sensing resistors 18a–18d when a translational force is applied. The side surface 30, however, is not limited to the illustrated embodiment but may have a variety of configurations, e.g., contoured or pointed profiles for engagement with the force sensing resistors.

The assembly 17 also includes a second member 34 attached to the puck 22 for moving the puck 22 in response to a force being applied by a user's hand to the second member. As shown, the second member 34 has a first region or disk-like body 36 having top and bottom disk surfaces 38 and 39, respectively, and a centrally located aperture or hole 33. The centrally located aperture 33 extends through the disk-like body 36 from the top disk surface 38 to the bottom disk surface 39. A second region or knob or grip 44 of the member 34 is disposed on the top disk surface 38. The knob 44 has top and bottom knob surfaces 40 and 41 and a centrally located recess 43 extending from the bottom knob surface 41 toward the top knob surface 40. A centrally located shaft 42 positioned in the recess 43 of the knob 44 extends through the aperture 33 of the disk-like body 36 and is positioned in the centrally located recess 32 of the puck 22.

The shaft 42, which extends from the knob 44 into the recess 32 of the puck 22, may be adapted to provide different feels for the user. Thus, a rigid material can be used for the shaft 42 to restrict travel of the knob 44. This provides a "stiff" or "hard" feel to the hand of a user. On the other hand, a pliable material can be used for the shaft 42. This allows greater knob movement and provides a "soft" or "spongy" feel to the user.

As shown in FIGS. 2 and 3, the diameter of the disk-like body 36 extends beyond the width of the puck 22 and is of sufficient dimension to allow support of the palm of the user's hand. This arrangement reduces wrist fatigue of the user while using the controller apparatus 10.

As shown in FIG. 2, each of the force sensing resistors 18a–18d has a front side 46 and a back side 48 with the back side 48 being proximate to the inner surface 20 of the wall 16 of the cup 12 and the front side 46 being proximate to the side surface 30 of the puck 22. Spacers or engaging pads 50 are positioned between the side surface 30 of the puck 22 and the front sides 46 of the force sensing resistors. Each pad 50 comprises a compressible material such as a polyurethane foam. Based upon how the puck 22 is fitted within the cup 12, a pre-loading force is applied to the respective force sensing resistor through the pad 50.

Without a preloading force, each force sensing resistor has essentially an infinite resistance. Thus, if a small force is applied to a resistor, its resistance drastically drops, providing a response which is not easily controllable by the user. Therefore, by preloading each of the resistors 18a–18d with a respective pad 50 more accurate control can be achieved. Also, by preloading each force sensing resistor, the device being controlled will exhibit a more linear response to translational forces being applied by the user.

Buttons 52 and 54 are disposed on the knob 44 and provide signals for control of additional functions by the user depending on how the controller apparatus 10 is to be used. The buttons 52 and 54 may have a variety of forms and may also incorporate force sensing resistors for controlling the desired additional functions. The knob 44 may also be rotatable in relation to the disk-like body 36 to provide further control options for the controller apparatus 10. Also, the knob 44 and disk-like body 36 may rotate together or independently to accommodate various user positions.

FIGS. 1 and 2 illustrate the controller apparatus 10 in a stand-alone application. The controller apparatus 10 may also be fixed or mounted to a surface (not shown) to provide greater stability and support for the apparatus 10. The controller apparatus 10 may also be incorporated into a housing or structure to control any type of device. For example, one particular type of device might be a surveillance assembly including a camera and lens assembly. Depending on the configuration of the controller apparatus 10, the signals generated by the force sensing resistors can be utilized for control of different functions of the camera and lens assembly. Such functions may include panning and tilting of the camera and lens assembly. This may be accomplished by employing a microcomputer 100 to convert the generated signals into pan and tilt control signals, as shown in the block diagram in FIG. 5.

Figure 5:
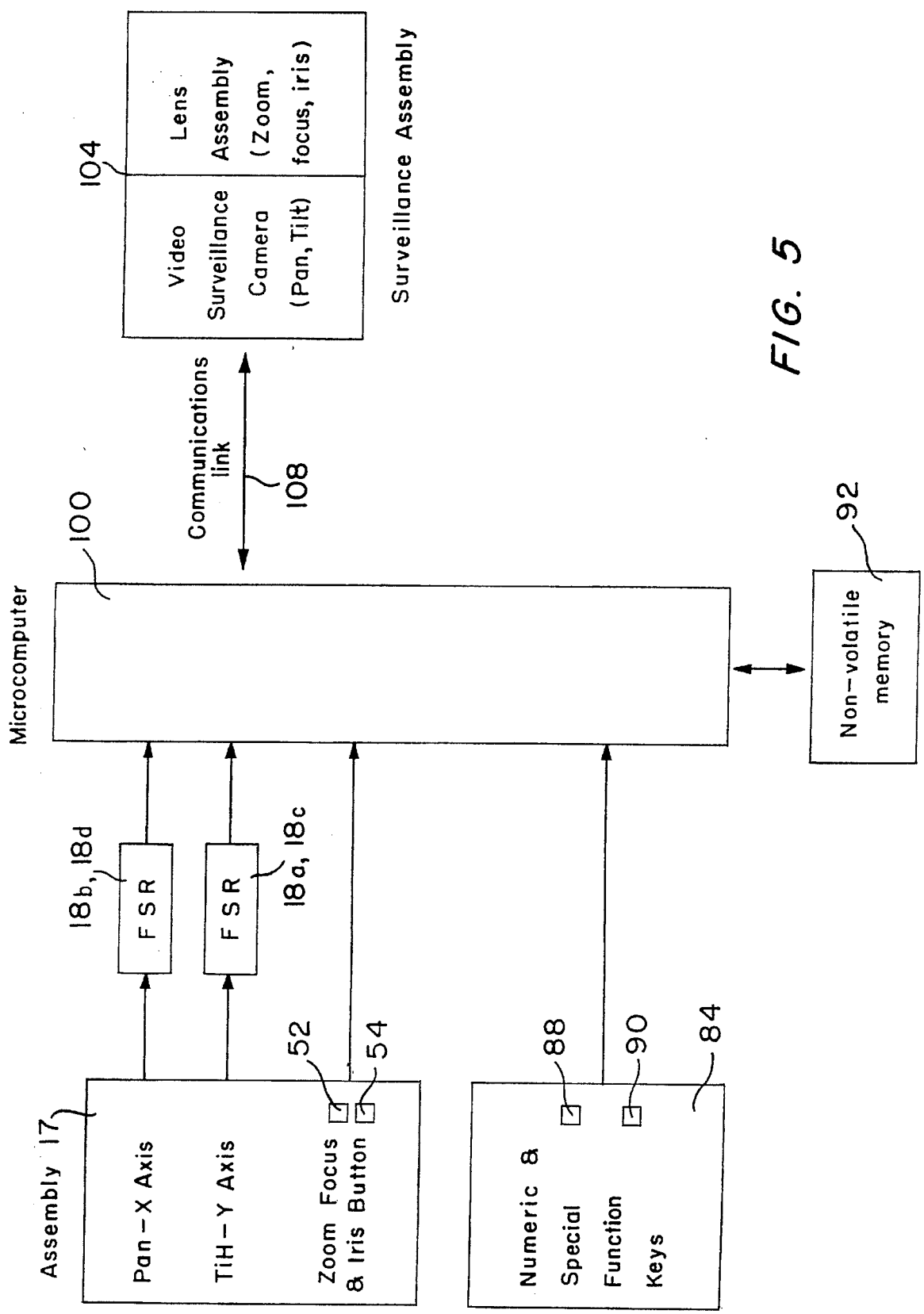
FIGS. 5 and 6 show block diagrams of the operational components of the controller assembly of FIG. 4.

In FIG. 5, the microcomputer 100 is responsive to signals from the force sensing resistors 18a–18d and from the buttons 52 and 54 of the controller apparatus 10. The microcomputer 100 is also responsive to signals from numeric and special function keys 88 and 90 of a keypad area 84. Based on these signals, the microcomputer 100 delivers appropriate control signals to the surveillance assembly 104 over a communications link 108.

More particularly, the microcomputer 100 determines from its scanning operation of the signals generated by actuation of the buttons 52 and 54 whether a function, such as focus, zoom or iris control, is to be changed. Also, depending upon the length of time of the signal, i.e., the length of time the respective button is pressed, the microcomputer 100 determines the speed of control for the function.

Likewise, based on the signals from the force sensing resistors 18a–18d, the microcomputer 100 determines whether panning and tilting functions are to be changed and the speed of the function. For example, a slight translational movement of the assembly 17 to the right causes the force sensing resistor 18b to output an appropriate X axis displacement signal to the microcomputer 100. The microcomputer 100 then interprets the signal and generates a pan right control signal. Increased force from the assembly 17 to the right causes an increased output from the resistor 18b. The microcomputer 100 again interprets this signal and develops an increased speed pan right command for controlling the pan right function.

Figure 4:
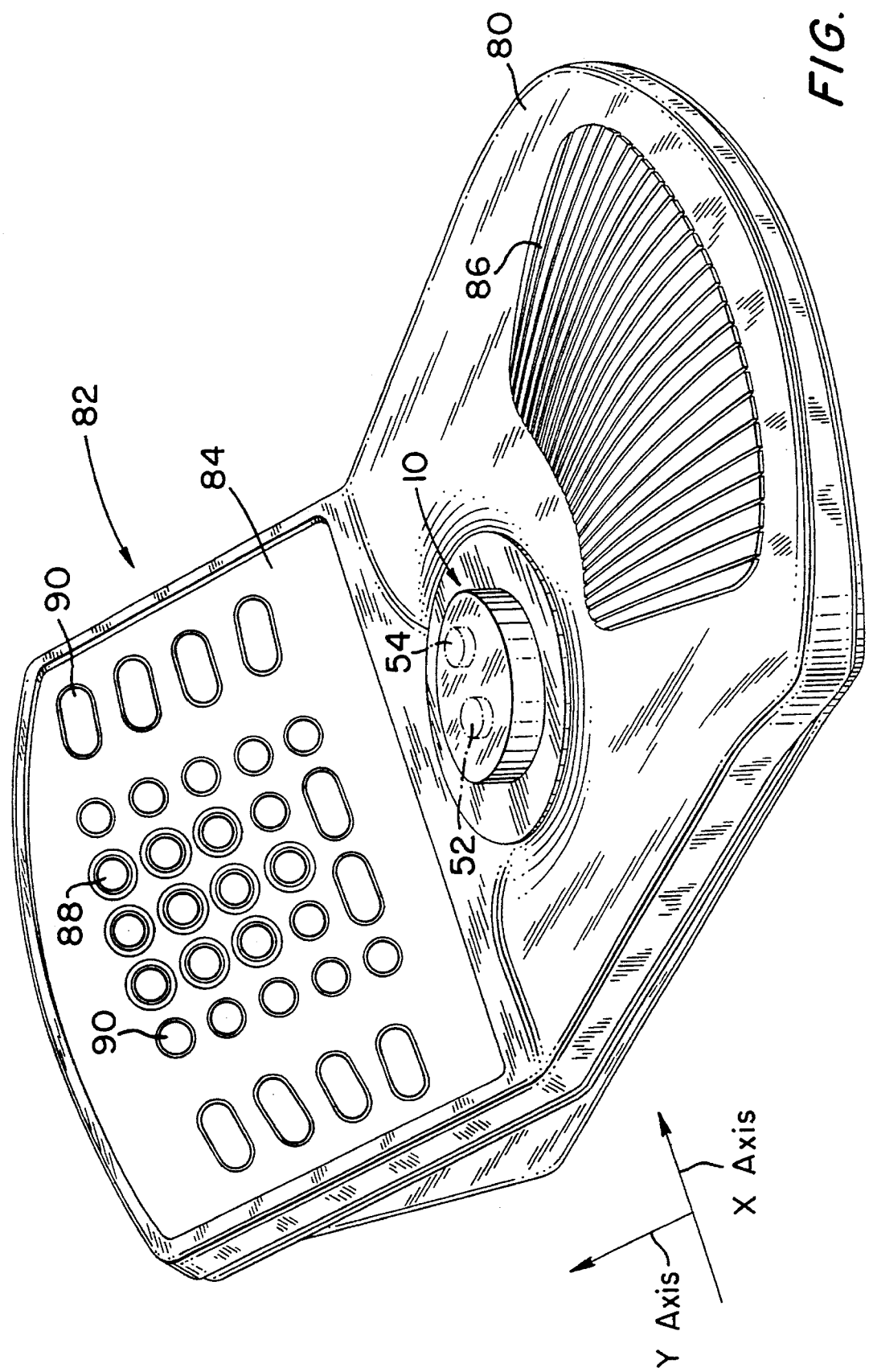
FIG. 4 shows the controller apparatus incorporated into a controller assembly.

FIG. 4 shows controller apparatus 10, keypad 84, and microcomputer 100 of FIG. 5 incorporated into a controller assembly 82. The assembly 82 houses the apparatus 10, keypad 84 and microcomputer 100 within a housing 80 having a palm rest 86. The housing includes an upright portion for holding the plurality of numeric and special function keys 88 and 90 of the keypad 84. The keys 88 and 90 can be used to control other functions of the surveillance assembly 104 and are symmetrical and preprogrammable for individual users based upon programs and data stored in a non-volatile memory 92 (see, FIG. 5) also included in the housing 80.

As above-noted, buttons 52 and 54 of the controller apparatus 10 can be used to control zoom, focus or iris functions of the lens unit of the surveillance assembly 104. The pan and tilt functions of the camera unit, in turn, are controlled by the assembly 17 of the apparatus 10.

Figure 6:
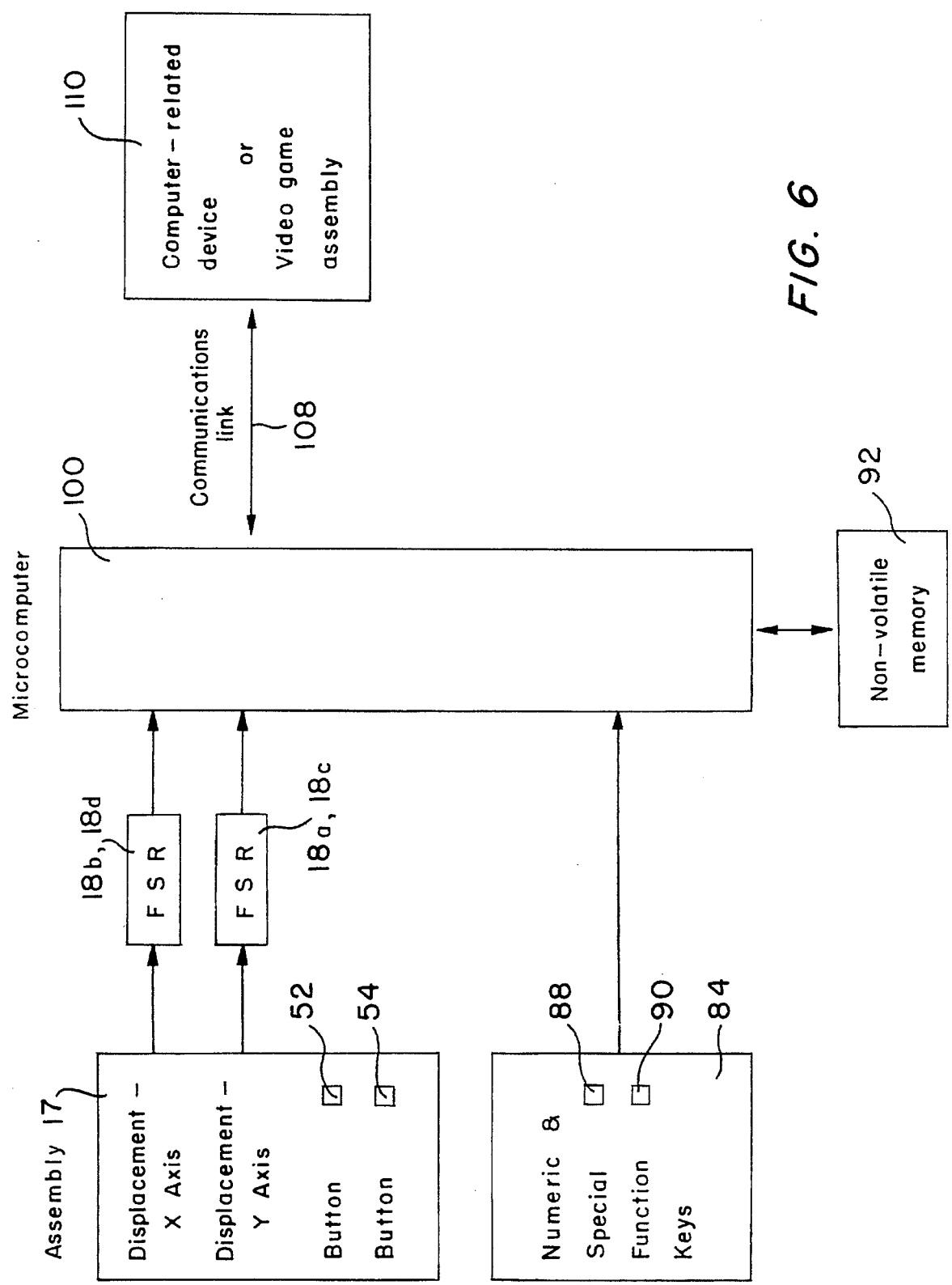

FIG. 6 illustrates similar components as in FIG. 5 but shows a computer-related device or video game assembly 110 being controlled by the controller apparatus 10 and the keypad 84. In this case, the signals for the force sensing resistors of the apparatus 10 would be used to control the X axis and Y axis displacement of a cursor or object on a computer or video screen of the device 110. The signals for the force sensing resistors may also be used in a variety of applications, such as controlling line thickness or color saturation, on the computer or video screen of the device 110.

The controller apparatus 10 of the present invention is not limited to the illustrated embodiments but may be any size or shape depending upon the requirements of the user. Thus, for example, the controller apparatus 10 may take on different configurations to accommodate one or two-handed use, the type of device being controlled and the way in which the controller apparatus is implemented in relation to another apparatus.

Also, the controller apparatus 10 is not confined to the support 12 being a cup-shaped configuration or utilizing four force sensing resistors. Other configurations dictated by the particular application and the needs of the user may also be developed. For example, a housing of an apparatus may be used to provide support for the assembly 17 and one or more force sensing resistors. In addition, the wall 16, rather than extending around the perimeter of the lower support surface 14, can also be an extension from the surface 14.

In addition, the configuration of the recess 43 in the knob 44 allows the user to insert a variety of different types of solid or hollow shafts depending upon the desired type of "feel" the user prefers as well as permitting insertion of any wiring (not shown) for the buttons 52 and 54. The recess 43 may also extend the entire length of the knob 44 to allow the user to easily remove and replace the shaft. A movable top plate or portion (not shown) positioned on the knob may be used to conceal the recess 43.

The puck 22, disk-like body 36, knob 44 and cup 12 of the controller apparatus 10 are, preferably, made of plastic and are rigid or semi-rigid in strength. This provides adequate structural support for the controller apparatus 10. In addition, the disk-like body 36, knob 44 and shaft 42 may be molded as a single part and in other cases may be formed of separate parts engaging one another. In the latter case, pins, grooves, adhesive or any other retaining or attaching means may be used to assemble and hold the components together and to maintain the structural integrity of the controller apparatus 10 during operation.

The controller apparatus 10 may also be used in applications, other than the specific applications mentioned above. The controller apparatus 10 may, in general, be used in applications where control of an electronic device is required. Particular applications, might be as a controller for a simulator-type apparatus or a machine-controlled robot. Other applications might be as a controller for devices for educational development, medical, rehabilitative or handicap-specific applications.

In all cases it is understood that the above-described arrangements are merely illustrative of the many possible specific embodiments which represent applications of the present invention. Numerous and varied other configurations, can be readily devised in accordance with the principles of the present invention without departing from the spirit and scope of the invention.

What is claimed is:

1. A controller apparatus for controlling a device, said controller apparatus comprising:

a support having a surface and a wall extending from the surface and along a segment of said surface, said wall having an inner surface;

a plurality of force sensing resistors positioned in a predetermined arrangement adjacent to the inner surface of said wall, each of said plurality of force sensing resistors generating a signal in response to a force applied to the force sensing resistor; and means for engaging said plurality of force sensing resistors, said means comprising:

a cylindrically-shaped puck being supported by said support and within a region defined by said inner surface of said wall, said puck having top and bottom puck surfaces and a recess extending from said top puck surface toward said bottom puck surface and being translationally movable to selectively engage and transmit a translational force to said plurality of force sensing resistors, and translational force applied to a force sensing resistor causing said force sensing resistor to generate a signal for controlling a function of the device, and a second member attached to said puck for translationally moving said puck in response to a force being applied by a user's hand to said second member, said second member includes a disk-like body having top and bottom disk surfaces and an aperture extending from said top disk surface through said bottom is surface, and a shaft extending through the aperture of the disk-like body and engaging the disk-like body and being positioned in the recess of said puck.

2. A controller apparatus in accordance with claim 1, wherein said second member comprises the disk-like body having a region for supporting user's palm and another region for supporting the user's fingers.

3. A controller apparatus in accordance with claim 1, wherein:

said second member includes the disk-like body and a knob disposed on the disk like body.

4. A controller apparatus in accordance with claim 3, wherein:

said recess of said puck is centrally located and extends from said top puck surface toward said bottom puck surface, said aperture of said disk-like body is centrally located and extends from said top disk surface through said bottom disk surface, said shaft being centrally located and positioned in said recess of said knob extends through the aperture of said disk-like body and engages said disk-like body and is positioned in said centrally located recess of said puck.

5. A controller apparatus in accordance with claim 4, wherein said shaft is a pliable material.

6. A controller apparatus in accordance with claim 4, wherein said shaft is a rigid material.

7. A controller apparatus in accordance with claim 4, wherein said puck, said disk-like body and said knob are plastic.

8. A controller apparatus in accordance with claim 1, wherein:

said puck is located within the region defined by the inner surface of said wall, said puck having top, bottom and side puck surfaces; and each said force sensing resistor has front and back sides, said back side proximate to the inner surface of said wall and the front side proximate to the side surface of the puck.

9. A controller apparatus in accordance with claim 8, wherein:

said recess of said puck is centrally located and extends from said top puck surface toward said bottom puck surface; and said second member includes:

said disk-like body extending in diameter beyond the width of the said puck and the aperture of the disk-like body being centrally located and extending from said top disk surface through said bottom disk surface, and a knob disposed on said top disk surface having top and bottom knob surfaces and a centrally located recess extending from said bottom knob surface toward said top knob surface, the shaft being centrally located and positioned in said centrally located recess of said knob extends through the aperture of said disk-like body and is positioned in said centrally located recess of said puck.

10. A controller apparatus in accordance with claim 9, wherein:

said plurality of force sensing resistors includes four force sensing electrode strips equally spaced along the inner surface of said wall, each of said force sensing electrode strips being centrally and symmetrically positioned about one of 0°, 90°, 180° and 270° positions proximate to said inner surface of said wall for bearing engagement against the inner surface of said wall when a translational force is applied to the force sensing strip.

11. A controller apparatus in accordance with claim 10, wherein:

the signal from a force sensing resistor varies as a function of the amount of translational force applied to the force sensing resistor and is used to correspondingly vary the magnitude of control of the function.

12. A controller apparatus in accordance with claim 11, wherein:

the signal from the force sensing resistor is used to correspondingly vary the speed of control of the function.

13. A controller apparatus in accordance with claim 12, wherein:

said device is a surveillance assembly including a camera and lens assembly; and said function of said camera and lens assembly includes at least one of panning, tilting, focusing, zooming and iris control of said camera and lens assembly.

14. A controller apparatus in accordance with claim 12, wherein:

said device is a computer-related device or video game assembly; and said function of said device or assembly includes controlling displacement of a cursor or object in the X axis or the Y axis.

15. A controller apparatus in accordance with claim 1, wherein:

said device is a surveillance assembly including a camera and lens assembly; and a function of said camera and lens assembly includes at least one of panning, tilting, focusing, zooming and iris control of said camera and lens assembly.

16. A controller apparatus in accordance with claim 1, wherein:

said device is a computer-related device or video game assembly; and a function of said device or assembly includes controlling displacement of a cursor or object in the X axis or the Y axis.

17. A controller apparatus in accordance with claim 1, wherein:

said disk-like body has a bottom disk surface extending in width beyond the width of the top surface of the puck.

18. A controller apparatus in accordance with claim 17, wherein said shaft is a pliable material.

19. A controller apparatus in accordance with claim 17, wherein said shaft is a rigid material.

20. A controller apparatus in accordance with claim 1, further comprising:

a microcomputer responsive to signals from said plurality of force sensing resistors for developing control signals based thereon.

21. A controller apparatus in accordance with claim 1, wherein:

said surface and wall of said support form a cup;

and said puck is disposed in said cup.

22. A controller apparatus in accordance with claim 1, wherein said shaft is a pliable material.

23. A controller apparatus in accordance with claim 1, wherein said shaft is a rigid material.

* * * * *

UNITED STATES PATENT AND TRADEMARK OFFICE
CERTIFICATE OF CORRECTION

PATENT NO. : 5,515,044
DATED : May 7, 1996
INVENTOR(S) : Terry L. Glatt

It is certified that error appears in the above-indentified patent and that said Letters Patent is hereby corrected as shown below:

Col. 7, after line 3, insert -- said knob disposed on said top disk surface having top and bottom knob surfaces and a centrally located recess extending from said bottom knob surface toward said top knob surface, and --.

Signed and Sealed this

Fifteenth Day of October, 1996

Attest:

BRUCE LEHMAN

*Attesting Officer*    *Commissioner of Patents and Trademarks*